United States Patent [19]

Yokozaki

[11] Patent Number: 5,264,805
[45] Date of Patent: Nov. 23, 1993

[54] AMPLIFIER FOR LIMITER

[75] Inventor: Katsushi Yokozaki, Yokohama, Japan

[73] Assignee: Matsushita Electric Industrial Co., Ltd., Kadoma, Japan

[21] Appl. No.: 895,271

[22] Filed: Jun. 8, 1992

[30] Foreign Application Priority Data

Aug. 13, 1991 [JP] Japan .................. 3-226375

[51] Int. Cl.[5] .................................. H03F 1/34
[52] U.S. Cl. ........................ 330/107; 330/306; 330/310
[58] Field of Search ............ 330/107, 109, 150, 294, 330/302, 306, 310

[56] References Cited

U.S. PATENT DOCUMENTS

| | | | |
|---|---|---|---|
| 3,863,173 | 1/1975 | Scheib et al. | 330/98 |
| 4,275,357 | 6/1981 | Nakayama et al. | 330/107 |
| 4,659,995 | 4/1987 | Feistel | 328/167 |
| 4,782,305 | 11/1988 | Westwick et al. | 330/294 X |
| 5,063,356 | 11/1991 | Voorman | 330/306 |

FOREIGN PATENT DOCUMENTS 60-38906  2/1985  Japan .

Primary Examiner—Steven Mottola
Attorney, Agent, or Firm—Spencer, Frank & Schneider

[57] ABSTRACT

A limiter amplifier includes amplifiers connected in cascade each having differential outputs and differential inputs, and a lowpass filter connected between adjacent amplifiers. The filter includes resistors having different values connected between the differential outputs and the differential inputs of adjacent amplifiers, and a capacitor connected between the differential inputs of one of the adjacent amplifiers, the filter thereby limiting a high frequency characteristic of the limiter amplifier.

2 Claims, 2 Drawing Sheets

PRIOR ART

AMPLIFIER FOR LIMITER

BACKGROUND OF THE INVENTION

This invention relates to a limiter amplifier which is suitable for constituting a direct conversion system FSK (Frequency Shift Keying) signal receiver having excellent sensitivity and band characteristics.

A practical FSK signal receiver, such as is used in a pager, has most of its parts constructed to form a direct conversion system which can be integrated on an integrated circuit (IC) for small size and low cost of the apparatus. The limiter amplifier is used for a FSK receiver which employs an intermediate frequency.

FIG. 3 shows the construction of a first conventional limiter amplifier. In FIG. 3, there are shown amplifiers 11 and coupling capacitors 12. The amplifiers 11 are cascaded through each of the coupling capacitors 12.

FIG. 4 shows the construction of a second conventional amplifier. In FIG. 4, there are shown differential-input differential-output amplifiers 1, feedback resistors 2, 4, 5 and bypass capacitors 3, 6. The amplifiers 1 are differentially DC-connected, and the output of the series of amplifiers is fed back to the input through the feedback resistors 2, 4 and 5.

However, since the conventional limiter amplifiers given above obtain a large gain in the intermediate frequency band, it is difficult to obtain a large gain in the low frequency band which is necessary in a direct conversion system limiter amplifier In other words, in the conventional example shown in FIG. 3, the capacitance of the coupling capacitors 12 must be increased in order that a large gain can be assured in the low frequency band, and thus it is difficult to incorporate such coupling capacitors in an IC. Moreover, since the conventional example shown in FIG. 4 is able to obtain a large gain over a frequency range including and above the low frequency band necessary in a direct conversion system, the S/N ratio of a desired signal is decreased. It is desirable that a limiter amplifier used for a direct conversion system have a large gain only within a necessary low frequency band (for example, 1 kHz to 10 kHz).

SUMMARY OF THE INVENTION

Accordingly it is an object of the invention to provide a limiter amplifier capable of obtaining a large gain only within a necessary low frequency band.

According to this invention, in order to achieve the above object, a low-pass filter comprised, for example, of a resistor and a capacitor, is inserted at a connection point between one or more of the cascaded amplifiers, thereby limiting the frequency characteristic in a high frequency range.

Therefore, according to this invention, since the gain in a frequency range above the frequency band necessary in the direct conversion system is limited by the one or more low-pass filters inserted within the limiter amplifier, a direct conversion system FSK signal receiver can be constructed with excellent sensitivity and band characteristics.

DESCRIPTION OF THE PREFERRED EMBODIMENT

Figure 1:
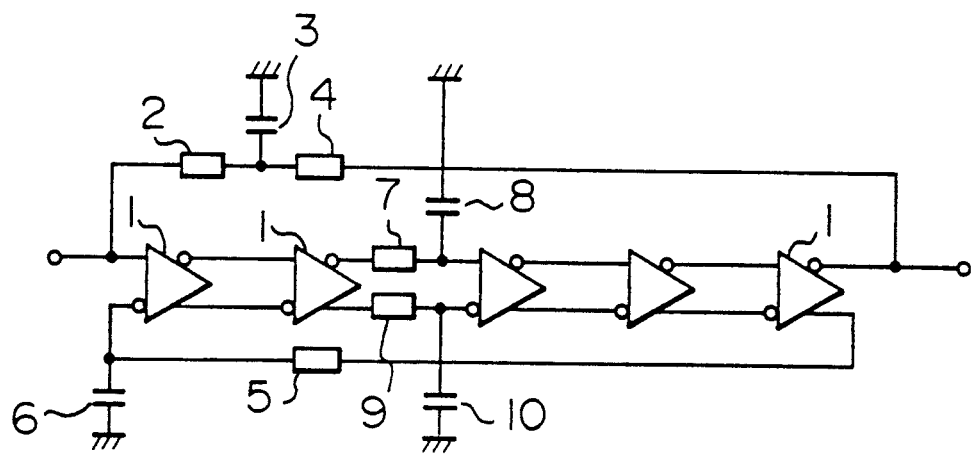
FIG. 1 is a block diagram of a limiter amplifier of a first embodiment of the invention.

FIG. 1 is a block diagram of a first embodiment of the invention. Referring to FIG. 1, there are shown differential-input differential-output amplifiers 1, feedback resistors 2, 4, 5, and bypass capacitors 3, 6. The feedback resistors 2, 4, 5 and bypass capacitors 3, 6 constitute feedback circuits. Shown at 7, and 9 are resistors for a low-pass filter, and 8 and 10 are capacitors for a low-pass filter. The resistors 7 and 9 and the capacitors 8 and 10 therefore constitute a low-pass filter. This low-pass filter is able to suppress the gain of the limiter amplifier in a high-frequency range, and thus it is possible to obtain a large gain only within the frequency band, which is necessary for a direct conversion system.

Figure 2:
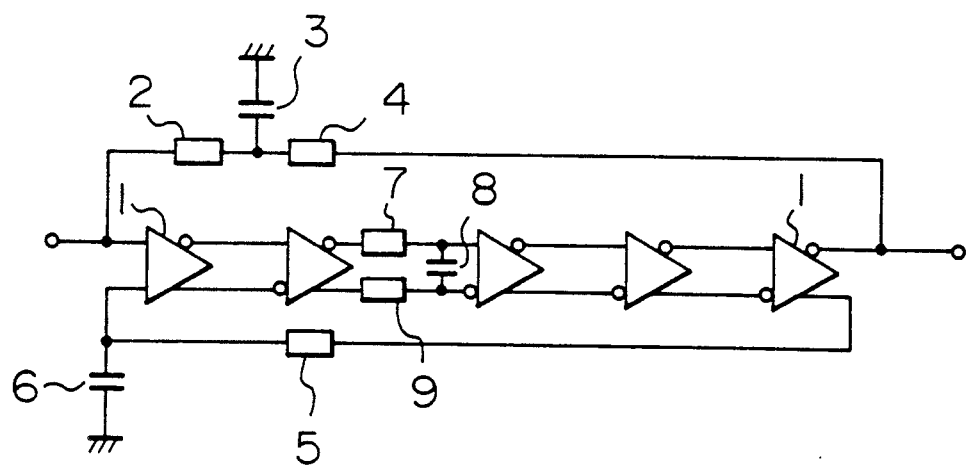
FIG. 2 is a block diagram of limiter amplifier of a second embodiment of the invention.
Figure 3:
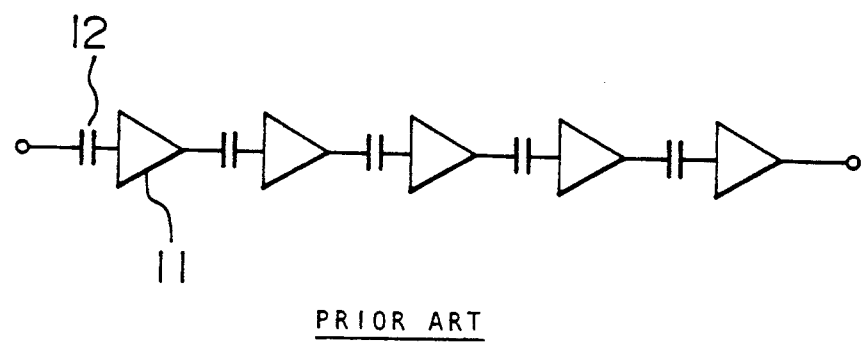
FIG. 3 is a block diagram of a first conventional limiter amplifier.
Figure 4:
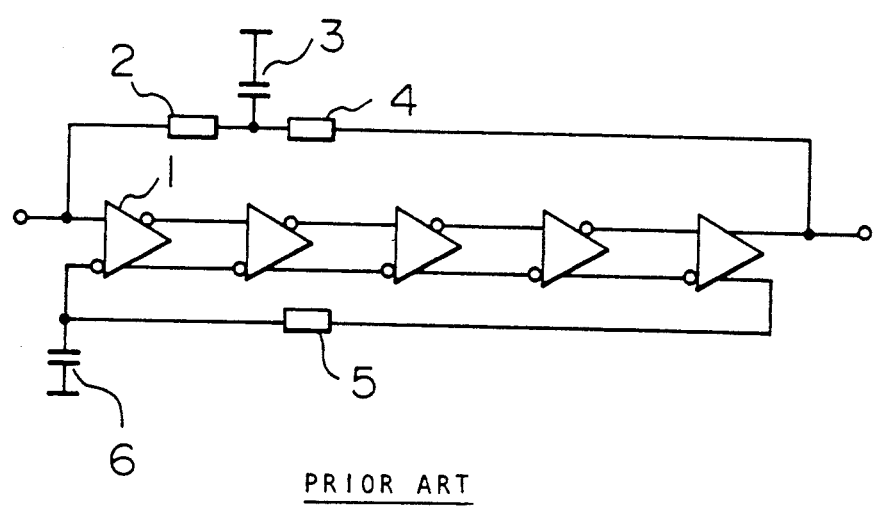
FIG. 4 is a block diagram of a second conventional limiter amplifier.

FIG. 2 is a block diagram of a second embodiment of the invention. In FIG. 2, like elements corresponding to those in FIG. 1 are identified by the same reference numerals, e.g., resistors 7 and 9. The second embodiment has a capacitor connected between the differential inputs of one of the cascaded amplifiers so that, in conjunction with resistors 7 and 9, a low-pass filtering characteristic is obtained. In FIGS. 1 and 2, the values of the capacitors for low-pass filters necessary for the low-pass filtering characteristic are dimensioned to be as small as practical for incorporation in integrated circuit (IC).

While in the above embodiments the low-pass filter is shown inserted only at one place between the cascaded amplifiers, the low pass filter may be inserted at other places therebetween, thereby further improving the frequency characteristics. Moreover, for example, a capacitor may be connected in parallel to a resistor load for each of the cascaded amplifiers to provide a low-pass filtering characteristic, and to equalize the total frequency characteristic of the limiter amplifier comprising cascaded amplifiers to that desired in the above described embodiment.

As will be readily apparent from the described embodiments of the invention, the limiter amplifier having amplifiers differentially cascaded includes a low-pass filter by which the gain of the limiter amplifier can be limited to the low frequency band which is necessary in a direct conversion system, thus making it possible to construct an FSK receiver which has excellent sensitivity and band characteristics.

I claim:

1. A limiter amplifier for use in an FSK direct conversion system receiver, the limiter amplifier having an input and an output and comprising:
    a plurality of cascaded, differential input, differential output amplifiers, an input of a first one of said cascaded amplifiers providing the limiter amplifier input and an output of a last one of said cascaded amplifiers providing the limiter amplifier output;
    feedback circuitry coupled between the limiter amplifier input and the limiter amplifier output; and
    lowpass filter means, disposed between at least one pair of cascaded amplifiers, for limiting limiter amplifier gain in a high-frequency range;
    wherein said lowpass filer means comprises first and second resistors which connect first and second differential outputs of a first amplifier of the at least one pair to respective first and second differential inputs of a second amplifier of the at least one pair, and a capacitor connected to the first and second resistors across the first and second differential inputs of the second amplifier of the at least one pair.

2. The limiter amplifier according to claim 1, wherein the first and second resistors have different resistance values.

* * * * *